US009323276B2

(12) United States Patent
Im

(10) Patent No.: US 9,323,276 B2
(45) Date of Patent: Apr. 26, 2016

(54) VOLTAGE GENERATION CIRCUIT

(71) Applicant: SK hynix Inc., Icheon-si Gyeonggi-do (KR)

(72) Inventor: Jong Man Im, Icheon-si (KR)

(73) Assignee: SK HYNIX INC., Icheon-si, Gyeonggi-do (KR)

( * ) Notice: Subject to any disclaimer, the term of this patent is extended or adjusted under 35 U.S.C. 154(b) by 529 days.

(21) Appl. No.: 13/710,705

(22) Filed: Dec. 11, 2012

(65) Prior Publication Data

US 2014/0062445 A1 Mar. 6, 2014

(30) Foreign Application Priority Data

Aug. 29, 2012 (KR) .................. 10-2012-0095229

(51) Int. Cl.
*G05F 5/00* (2006.01)
*G11C 5/14* (2006.01)
(52) U.S. Cl.
CPC . *G05F 5/00* (2013.01); *G11C 5/147* (2013.01)
(58) Field of Classification Search
CPC ............... G05F 5/00; H03K 3/00; H03K 5/15
USPC ........... 323/266, 268, 299; 327/291, 293, 295
See application file for complete search history.

(56) References Cited

U.S. PATENT DOCUMENTS

| 7,345,931 | B2* | 3/2008 | Partsch et al. ............ 365/189.09 |
| 7,633,824 | B2* | 12/2009 | Kato .............................. 365/226 |
| 7,999,605 | B2* | 8/2011 | Seo ................................ 327/536 |
| 8,416,003 | B2* | 4/2013 | Chen et al. .................... 327/291 |
| 8,588,020 | B2* | 11/2013 | Chen ............................. 365/207 |
| 2010/0052771 | A1 | 3/2010 | Hartono |
| 2011/0273214 | A1* | 11/2011 | Nakagawara ................. 327/291 |
| 2012/0169407 | A1* | 7/2012 | Noh .............................. 327/536 |

FOREIGN PATENT DOCUMENTS

KR 1020100088955 A 8/2010

* cited by examiner

Primary Examiner — Matthew Nguyen
(74) Attorney, Agent, or Firm — William Park & Associates Ltd.

(57) ABSTRACT

A voltage generation circuit includes a plurality of voltage generation units each configured to include an internal voltage with a reference voltage, generate a detection signal based on a comparison result between the internal voltage and the reference voltage, and adjust the level of the internal voltage in response to an oscillation signal, a control unit configured to generate an oscillation control signal in response to the detection signals, an oscillator configured to generate the oscillation signal in response to the oscillation control signal, and a selective output unit configured to selectively supply the oscillation signal to one or more of the plurality of voltage generation units in response to the detection signals.

4 Claims, 2 Drawing Sheets

VOLTAGE GENERATION CIRCUIT

CROSS-REFERENCES TO RELATED APPLICATION

The present application claims priority under 35 U.S.C. §119(a) to Korean application number 10-2012-0095229, filed on Aug. 29, 2012, in the Korean Intellectual Property Office, which is incorporated herein by reference in its entirety.

BACKGROUND

1. Technical Field

The present invention relates generally to a semiconductor circuit, and more particularly, to a voltage generation circuit.

2. Related Art

An electronic circuit, such as semiconductor memory or a AC-DC converter, uses internal voltages having a variety of voltage levels.

The electronic circuit includes a voltage generation circuit for generating the internal voltages having a variety of voltage levels.

As shown in FIG. 1, the known voltage generation circuit 1 includes a plurality of voltage generation units for generating a plurality of internal voltages.

FIG. 1 has been illustrated as including only first to fourth voltage generation units 10-40 for generating a plurality of internal voltages used in semiconductor memory, for example, first to fourth internal voltages VPP, VPPY, VBB, and VBBW.

The first voltage generation unit 10 includes a VPP oscillator (VPP OSC), a VPP pump, and a VPP detector.

The VPP OSC generates an oscillation signal and supplies it to the VPP pump.

The VPP pump raises the level of the first internal voltage VPP in response to the oscillation signal of the VPP OSC.

The VPP detector generally drives the VPP OSC based on a comparison result between a reference voltage and a first internal voltage VPP. The VPP detector of the first voltage generation unit 10 drives the VPP OSC based on a comparison result between a division voltage having been divided in a proper division ratio and the reference voltage so that the first internal voltage VPP substantially corresponds to the reference voltage.

The VPP detector drives the VPP OSC when the division voltage is lower than the reference voltage and stops the driving of the VPP OSC when the division voltage is above the reference voltage.

The first internal voltage VPP maintains a target level through the repetition of the above-described process.

Each of the second to fourth voltage generation units 20-40 has the same construction as the first voltage generation unit 10 and operates like the first voltage generation unit 10 in order to maintain each of second to fourth internal voltages VPPY, VBB, and VBBW at a target level.

The first to fourth internal voltages VPP, VPPY, VBB, and VBBW of FIG. 1 have different target levels, and thus the reference voltages of the detectors of the first to fourth voltage generation units 10-40 are set to different values.

In the known voltage generation circuit 1, the VPP OSC, the VPPY OSC, the VBB OSC, and the VBBW OSC are provided in the first to fourth voltage generation units 10-40, respectively.

Accordingly, there is a problem in that the configured oscillators increase area and current consumption of the voltage generation circuit.

The problem of increasing area and current consumption becomes more severe as internal voltage increases.

SUMMARY

A voltage generation circuit with reduced area and current consumption is described herein.

In an embodiment, a voltage generation circuit may include a plurality of voltage generation units each configured to include an internal voltage with a reference voltage, generate a detection signal based on a comparison result between the internal voltage and the reference voltage, and adjust the level of the internal voltage in response to an oscillation signal, a control unit configured to generate an oscillation control signal in response to the detection signals, an oscillator configured to generate the oscillation signal in response to the oscillation control signal, and a selective output unit configured to selectively supply the oscillation signal to one or more of the plurality of voltage generation units in response to the detection signals.

In another embodiment, a voltage generation circuit may include a plurality of voltage generation units each configured to generate an internal voltage in response to an oscillation signal, and an oscillator shared by the plurality of voltage generation units and configured to generate the oscillation signal, wherein the oscillation signal is supplied to one or more of the plurality of the voltage generation units that output internal voltages each deviating from a target level.

BRIEF DESCRIPTION OF THE DRAWINGS

Features, aspects, and embodiments are described in is conjunction with the attached drawings, in which.

DETAILED DESCRIPTION

Hereinafter, a voltage generation circuit according to the presently claimed invention will be described below with reference to accompanying drawings through various embodiments.

Figure 2:
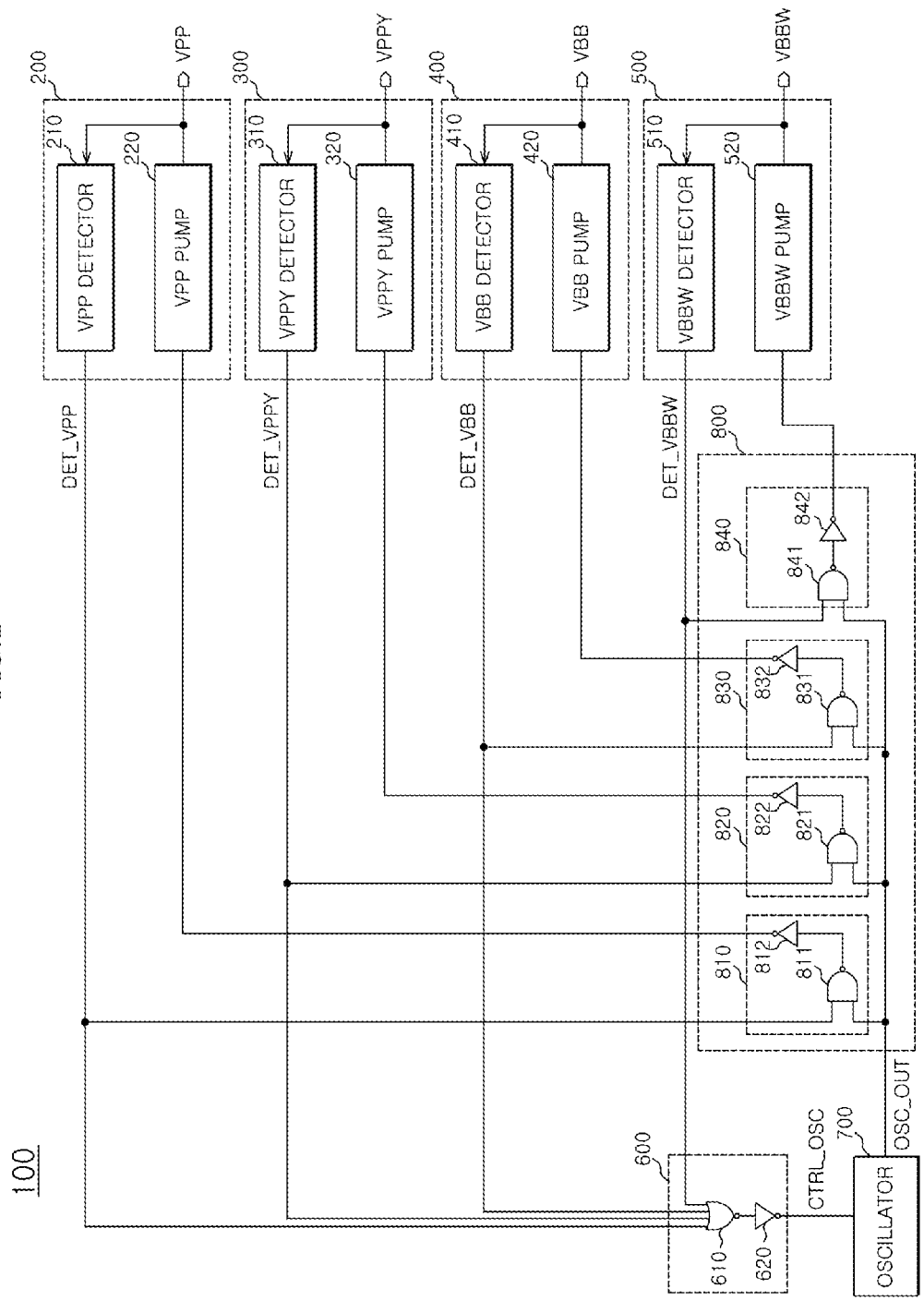
FIG. 2 is a circuit diagram of a voltage generation circuit 100 in accordance with an embodiment.

FIG. 2 is a circuit diagram of a voltage generation circuit 100 in accordance with an embodiment.

As shown in FIG. 2, the voltage generation circuit 100 in accordance with an embodiment includes first to fourth voltage generation units 200-500, a control unit 600, an oscillator 700, and a selective output unit 800.

Figure 1:
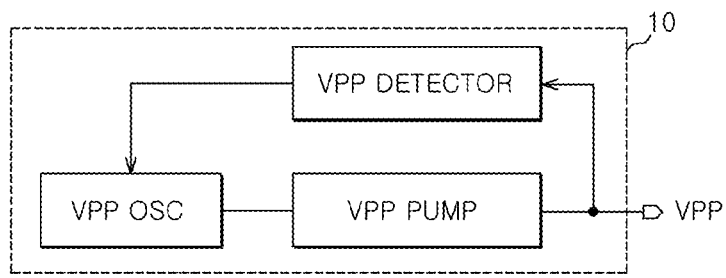
FIG. 1 is a block diagram of a known voltage generation circuit 1.
Figure 1:
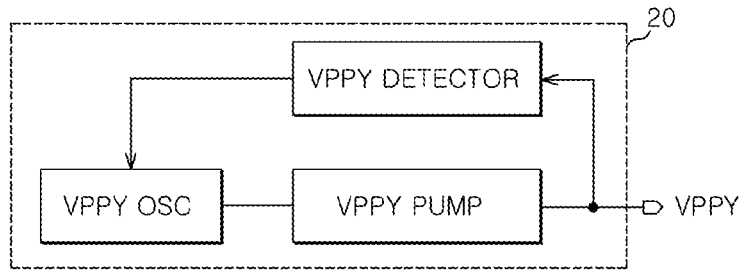
Figure 1:
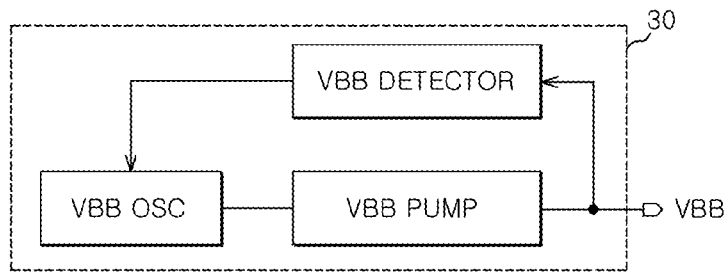
Figure 1:
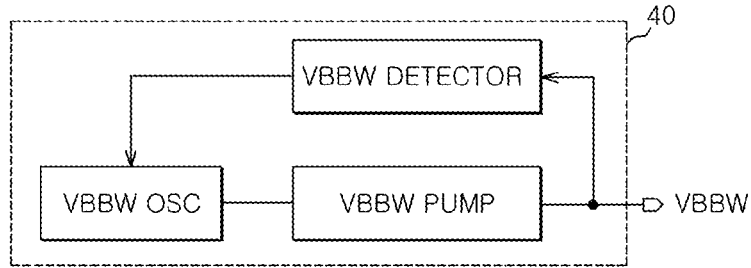

As described above, in FIG. 1, each of the first to fourth voltage generation units 10-40 is configured to include the detector, the pump, and the oscillator.

In an embodiment, however, the first to fourth voltage generation units 200-500 are configured to include respective detectors and respective pumps and to share the one oscillator 700.

The first voltage generation unit 200 is configured to compare a first internal voltage VPP with a first reference voltage, generate a first detection signal DET_VPP, and adjust the level of the first internal voltage VPP in response to an oscillation signal OSC_OUT.

The first voltage generation unit 200 includes a VPP detector 210 and a VPP pump 220.

The VPP pump 220 adjusts the level of the first internal voltage VPP in response to the oscillation signal OSC_OUT.

The VPP detector 210 compares the first internal voltage VPP with the first reference voltage and generates the first detection signal DET_VPP based on the comparison result.

Specifically, the VPP detector 210 compares a division voltage, divided in a proper division ratio so that the first internal voltage VPP substantially corresponds to the first reference voltage, with the first reference voltage and generates the first detection signal DET_VPP based on the comparison result.

The second voltage generation unit 300 is configured to compare a second internal voltage VPPY with a second reference voltage, generate a second detection signal DET_VPPY based on the comparison result, and adjust the level of the second internal voltage VPPY in response to the oscillation signal OSC_OUT.

The second voltage generation unit 300 includes a VPPY detector 310 and a VPPY pump 320.

The VPPY pump 320 adjusts the level of the second internal voltage VPPY in response to the oscillation signal OSC_OUT.

The VPPY detector 310 compares the second internal is voltage VPPY with the second reference voltage and generates the second detection signal DET_VPPY based on the comparison result.

Specifically, the VPPY detector 310 compares a division voltage, divided in a proper division ratio so that the second internal voltage VPPY substantially corresponds to the second reference voltage, with the second reference voltage and generates the second detection signal DET_VPPY based on the comparison result.

The third voltage generation unit 400 is configured to compare a third internal voltage VBB with a third reference voltage, generate a third detection signal DET_VBB based on the comparison result, and adjust the level of the third internal voltage VBB in response to the oscillation signal OSC_OUT.

The third voltage generation unit 400 includes a VBB detector 410 and a VBB pump 420.

The VBB pump 420 adjusts the level of the third internal voltage VBB in response to the oscillation signal OSC_OUT.

The VBB detector 410 compares the third internal voltage VBB with the third reference voltage and generates the third detection signal DET_VBB based on the comparison result.

Specifically, the VBB detector 410 compares a division voltage, divided in a proper division ratio so that the third internal voltage VBB substantially corresponds to the third reference voltage, with the third reference voltage and generates the third detection signal DET_VBB based on the comparison result.

The fourth voltage generation unit 500 is configured to compare a fourth internal voltage VBBW with a fourth reference voltage, generate a fourth detection signal DET_VBBW, and adjusts the level of the fourth internal voltage VBBW in response to the oscillation signal OSC_OUT.

The fourth voltage generation unit 500 includes a VBBW detector 510 and a VBBW pump 520.

The VBBW pump 520 adjusts the level of the fourth internal voltage VBBW in response to the oscillation signal OSC_OUT.

The VBBW detector 510 compares the fourth internal voltage VBBW with the fourth reference voltage and generates the fourth detection signal DET_VBBW based on the comparison result.

Specifically, the VBBW detector 510 compares a division voltage, divided in a proper division ratio so that the fourth internal voltage VBBW substantially corresponds to the fourth reference voltage, with the fourth reference voltage and generates the fourth detection signal DET_VBBW based on the comparison result.

The first to fourth reference voltages used in the first to fourth voltage generation units 200-500 can be supplied by additional external blocks, respectively.

When the first to fourth internal voltages VPP-VBBW deviate from respective target levels, that is, when the first to fourth internal voltages VPP-VBBW are higher than or lower than the first to fourth reference voltages, the first to fourth voltage generation units 200-500 can output the first to fourth detection signals DET_VPP-DET_VBBW of a logic high level H.

The control unit 600 is configured to generate an oscillation control signal CTRL_OSC in response to the first to fourth detection signals DET_VPP-DET_VBBW.

The control unit 600 is configured to output the oscillation control signal CTRL_OSC when any one of the first to fourth detection signals DET_VPP-DET_VBBW is enabled, that is, when an internal voltage level has deviated from a reference voltage level.

The control unit 600 can include a plurality of logic gates 610 and 620 configured to perform an OR operation on the first to fourth detection signals DET_VPP-DET_VBBW and output a result of the OR operation as the oscillation control signal CTRL_OSC.

The oscillator 700 is configured to generate the oscillation signal OSC_OUT when the oscillation control signal CTRL_OSC is enabled.

The selective output unit 800 is configured to selectively provide the oscillation signal OSC_OUT to one or more of the first to fourth voltage generation units 200-500 in response to the first to fourth detection signals DET_VPP-DET_VBBW.

The selective output unit 800 is configured to provide the oscillation signal OSC_OUT to one or more voltage generation units that have outputted the first to fourth detection signals DET_VPP-DET_VBBW that are enabled, from among the first to fourth voltage generation units 200-500.

The selective output unit 800 is configured to preclude the oscillation signal OSC_OUT from being supplied to one or more voltage generation units that have outputted the first to fourth detection signals DET_VPP-DET_VBBW that are disabled, from among the first to fourth voltage generation units 200-500.

The selective output unit 800 includes first to fourth selective output units 810-840.

The first selective output unit 810 is configured to provide the oscillation signal OSC_OUT to the VPP pump 220 of the first voltage generation unit 200 when the first detection signal DET_VPP is enabled.

The first selective output unit 810 can include a plurality of logic gates 811 and 812 configured to perform an AND operation on the first detection signal DET_VPP and the oscillation signal OSC_OUT.

The second selective output unit 820 is configured to provide the oscillation signal OSC_OUT to the VPPY pump 320 of the second voltage generation unit 300 when the second detection signal DET_VPPY is enabled.

The second selective output unit 820 can include a plurality of logic gates 821 and 822 configured to perform an AND operation on the second detection signal DET_VPPY and the oscillation signal OSC_OUT.

The third selective output unit 830 is configured to provide the oscillation signal OSC_OUT to the VBB pump 420 of the third voltage generation unit 400 when the third detection signal DET_VBB is enabled.

The third selective output unit 830 can include a plurality of logic gates 831 and 832 configured to perform an AND operation on the third detection signal DET_VBB and the oscillation signal OSC_OUT.

The fourth selective output unit 840 is configured to provide the oscillation signal OSC_OUT to the VBBW pump 520 of the fourth voltage generation unit 500 when the fourth detection signal DET_VBBW is enabled.

The fourth selective output unit 840 can include a plurality of logic gates 841 and 842 configured to perform an AND operation on the fourth detection signal DET_VBBW and the oscillation signal OSC_OUT.

The voltage generation operation of the voltage generation circuit 100 as constructed above in accordance with an embodiment is described below.

In an initial operation, all the first to fourth detection signals DET_VPP-DET_VBBW will be enabled because all the first to fourth internal voltages VPP-VBBW have deviated from the target level.

The control unit 600 enables the oscillation control signal CTRL_OSC because all the first to fourth detection signals DET_VPP-DET_VBBW have been enabled.

The oscillator 700 generates the oscillation signal OSC_OUT in response to the enabled oscillation control signal CTRL_OSC.

The first to fourth selective output units 810-840 of the selective output unit 800 supply the oscillation signal OSC_OUT to the first to fourth voltage generation units 200-500 because all the first to fourth detection signals DET_VPP-DET_VBBW have been enabled.

In response thereto, the pumps 220-520 of the first to fourth voltage generation units 200-500 operate, thus changing the levels of the first to fourth internal voltages VPP-VBBW to match with the respective target levels.

In another scenario, it is assumed that the first internal voltage VPP from among the first to fourth internal voltages VPP-VBBW has not reached a corresponding target level, but the remaining internal voltages have reached respective target levels.

Since only the first internal voltage VPP has not reached the target level, the first detection signal DET_VPP is enabled, but all the second to fourth detection signals DET_VPPY-DET_VBBW are disabled.

The control unit 600 enables the oscillation control signal CTRL_OSC because the first detection signal DET_VPP from among the first to fourth detection signals DET_VPP-DET_VBBW has been enabled.

In response to the enabled oscillation control signal CTRL_OSC, the oscillator 700 generates the oscillation signal OSC_OUT.

When the first detection signal DET_VPP is enabled, the first selective output unit 810 of the selective output unit 800 supplies the oscillation signal OSC_OUT to the first voltage generation unit 200.

Accordingly, the VPP pump 220 of the first voltage generation unit 200 changes the level of the first internal voltage VPP to match with the target level.

The second to fourth selective output units 820-840 (i.e., a logic low level) preclude the oscillation signal OSC_OUT from being inputted to the second to fourth voltage generation units 300-500 because the second to fourth detection signals DET_VPPY-DET_VBBW have been disabled.

As a result, the operations of the pumps 320-520 of the second to fourth voltage generation units 300-500 are halted.

In accordance with the present invention, the area and current consumption for a voltage generation circuit is reduced. Accordingly, a layout margin of an electronic circuit including the voltage generation circuit can be increased, and operation efficiency can be improved.

While certain embodiments have been described above, it will be understood to those skilled in the art that the embodiments described are by way of example only. Accordingly, the voltage generation circuit described herein should not be limited based on the described embodiments. Rather, the circuit described herein should only be limited in light of the claims that follow when taken in conjunction with the above description and accompanying drawings.

What is claimed is:

1. A voltage generation circuit, comprising:
a plurality of voltage generation units each configured to generate an internal voltage in response to an oscillation signal; and
an oscillator shared by the plurality of voltage generation units and configured to generate the oscillation signal,
wherein the oscillation signal is supplied to one or more of the plurality of the voltage generation units that output internal voltages each deviating from a target level, and
wherein the oscillation signal is not supplied to others besides the one or more of the plurality of voltage generation units that output internal voltages satisfying respective target levels, from among the internal voltages.

2. The voltage generation circuit according to claim 1, wherein each of the plurality of voltage generation units is configured to perform an operation of determining whether each of the internal voltages has deviated from each of the target levels according to a comparison result between each of the internal voltages and each of the reference voltages.

3. The voltage generation circuit according to claim 1, wherein the oscillator is configured to generate the oscillation signal when any one of the internal voltages deviates from a corresponding target level.

4. A voltage generation circuit, comprising:
a plurality of voltage generation units each configured to generate an internal voltage in response to an oscillation signal; and
an oscillator configured to generate the oscillation signal,
wherein the oscillation signal is supplied to one or more of the plurality of the voltage generation units that output internal voltages deviating from respective target levels, and the oscillation signal is not supplied to others besides the one or more of the plurality of voltage generation units that output internal voltages satisfying the respective target levels.

* * * * *